United States Patent [19]
Hsu et al.

[11] Patent Number: 6,018,171
[45] Date of Patent: Jan. 25, 2000

[54] SHALLOW JUNCTION FERROELECTRIC MEMORY CELL HAVING A LATERALLY EXTENDING P-N JUNCTION AND METHOD OF MAKING THE SAME

[75] Inventors: Sheng Teng Hsu; Jong Jan Lee, both of Camas; Chien-Hsiung Peng, Vancouver, all of Wash.

[73] Assignees: Sharp Laboratories of America, Inc., Camas, Wash.; Sharp Kabushiki Kaisha, Osaka, Japan

[21] Appl. No.: 08/834,499

[22] Filed: Apr. 4, 1997

Related U.S. Application Data

[63] Continuation-in-part of application No. 08/812,579, Mar. 7, 1997, Pat. No. 5,731,608.

[51] Int. Cl.[7] .............................................. H01L 21/8242
[52] U.S. Cl. ............................... 257/295; 257/256; 438/3; 438/957
[58] Field of Search ................................ 438/3, 275, 957, 438/136, 186, 188, 238–240, 250–256, 393–399; 257/295, 287, 281, 256, 261

[56] References Cited

U.S. PATENT DOCUMENTS

| | | |
|---|---|---|
| 3,832,700 | 8/1974 | Wu et al. . |
| 4,419,809 | 12/1983 | Riseman et al. . |
| 5,070,029 | 12/1991 | Pfiester et al. . |
| 5,138,406 | 8/1992 | Calviello . |
| 5,300,799 | 4/1994 | Nakamura et al. . |
| 5,303,182 | 4/1994 | Nakao et al. . |
| 5,345,415 | 9/1994 | Nakao et al. . |
| 5,365,094 | 11/1994 | Takasu . |
| 5,373,462 | 12/1994 | Achard et al. . |
| 5,416,735 | 5/1995 | Onishi et al. . |
| 5,424,238 | 6/1995 | Sameshima . |
| 5,431,958 | 7/1995 | Desu et al. . |
| 5,446,688 | 8/1995 | Torimaru . |

FOREIGN PATENT DOCUMENTS

| | | |
|---|---|---|
| 4-256361 | 9/1992 | Japan . |
| 8-293565 | 11/1996 | Japan . |
| WO 96/13860 | 5/1996 | WIPO . |

OTHER PUBLICATIONS

Article entitled, Characteristics of NDRO Ferroelectric FETs with a Poly–Si Floating Gate, by T. Nakamura, Y. Nakao, A. Kamusawa and H. Takasu, published in 1995 IEEE proceedings, Aug., 1994, pp. 345–347, #XP000553149.

Jiang et al. "A New Electrode Technology for High–Density Nonvolatile Ferroelectric ($SrBi_2Ta_2O_9$) Memories" IEEE 1996 Symposium on VLSI Technology Digest of Technical Papers, pp. 26–27, 1966.

*Primary Examiner*—Jey Tsai
*Attorney, Agent, or Firm*—David C. Ripma; Gerald Maliszewski

[57] ABSTRACT

A method of forming the FEM cell semi-conductor structure includes forming a device area for the ferroelectric memory (FEM) gate unit on a silicon substrate. Appropriate impurities are implanted into the device area to form conductive channels, for use as a source junction region, a gate junction region and a drain junction region. A FEM cell includes a FEM gate unit formed on the substrate. A gate junction region is formed between the source junction region and the drain junction region for the FEM gate unit on the FEM gate unit device area, which FEM gate unit includes a lower metal layer, a ferroelectric (FE) layer, and an upper metal layer. A shallow junction layer is formed between the FEM gate unit and the gate junction region, as another conductive channel, which extends into the drain junction region. The FEM gate unit is spaced apart from the source region and the drain region, as is the conductive channel between the FEM gate unit and the gate junction region. Formation of the various conductive channels may take place at various stages of the manufacture, depending on what other devices are built on the substrate, and depending on the efficiencies of the various orders of construction. The structure of the FEM cell semiconductor includes a substrate, which may be a bulk silicon substrate or an SOI-type substrate. Conductive channels of two types are located above the substrate.

18 Claims, 6 Drawing Sheets

SHALLOW JUNCTION FERROELECTRIC MEMORY CELL HAVING A LATERALLY EXTENDING P-N JUNCTION AND METHOD OF MAKING THE SAME

RELATED APPLICATION

This application is a continuation-in-part of application Ser. No. 08/812,579, filed Mar. 7, 1997, U.S. Pat. No. 5,731,608 of Hsu et al., for ONE TRANSISTOR FERROELECTRIC MEMORY CELL AND METHOD OF MAKING THE SAME.

BACKGROUND OF THE INVENTION

This application relates to ferroelectric thin films which are used in nonvolatile memories and specifically to a shallow junction metal-ferroelectric-metal-silicon semiconductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303,182, which emphasizes that the transfer of metal ions into the gate region is undesirable. Similar structure is shown in U.S. Pat. No. 5,416,735.

It is an object of this invention to overcome the aforementioned problems.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

Yet another object of the invention is to provide an FEM gate unit which overlies a shallow junction p⁻ layer, which p⁻ layer extends beyond the margins of a gate junction region.

Still another object of the invention is to provide an FEM cell that contains an easily formed diffusion barrier therein.

Another object of the invention is to provide an FEM cell that includes a drain electrode that contacts both an n⁺ and a p⁻ conductive surface.

The method of forming the FEM cell semi-conductor structure of the invention includes forming a device area for the ferroelectric memory (FEM) gate unit on a silicon substrate. Appropriate impurities are implanted into the device area to form conductive channels, for use as a source junction region, a gate junction region and a drain junction region. A FEM cell includes a FEM gate unit formed on the substrate. A gate junction region is formed between the source junction region and the drain junction region for the FEM gate unit on the FEM gate unit device area, which FEM gate unit includes a lower metal layer, a ferroelectric (FE) layer, and an upper metal layer. A shallow junction layer is formed between the FEM gate unit and the gate junction region, as another conductive channel, which extends into the drain junction region. The FEM gate unit is spaced apart from the source region and the drain region, as is the conductive channel between the FEM gate unit and the gate junction region. Formation of the various conductive channels may take place at various stages of the manufacture, depending on what other devices are built on the substrate, and depending on the efficiencies of the various orders of construction.

The structure of the FEM cell semiconductor includes a silicon substrate, which may be a bulk silicon substrate or an SOI-type substrate. Conductive channels of two types are located above the substrate. A FEM gate unit is located above a gate region, wherein the FEM gate unit includes a lower metal layer, an FE layer, and an upper metal layer. Another conductive channel of a third type is located between the FEM gate unit and the channel region, and extends into the drain region. The FEM cell may be constructed in series with a conventional MOS transistor.

These and other objects and advantages of the invention will become more fully apparent as the description which follows is read in conjunction with the drawings.

DETAILED DESCRIPTION OF THE PREFERRED EMBODIMENTS

The ferroelectric memory (FEM) cell of the invention may be formed on a SOI (SIMOX) substrate, or, it may be formed in a bulk silicon substrate. The description herein will concentrate on the formation of the FEM gate unit on a bulk silicon substrate, however, as used herein, "silicon substrate" refers to either a SOI substrate or to a bulk silicon substrate. It should be appreciated that in some embodiments of the FEM gate unit, a MOS transistor is fabricated simultaneously with the ferroelectric memory cell by conventional means which are well known to those of ordinary skill in the art. Accordingly, for the sake of clarity, the drawings do not depict the formation of the MOS transistor.

Figure 1:
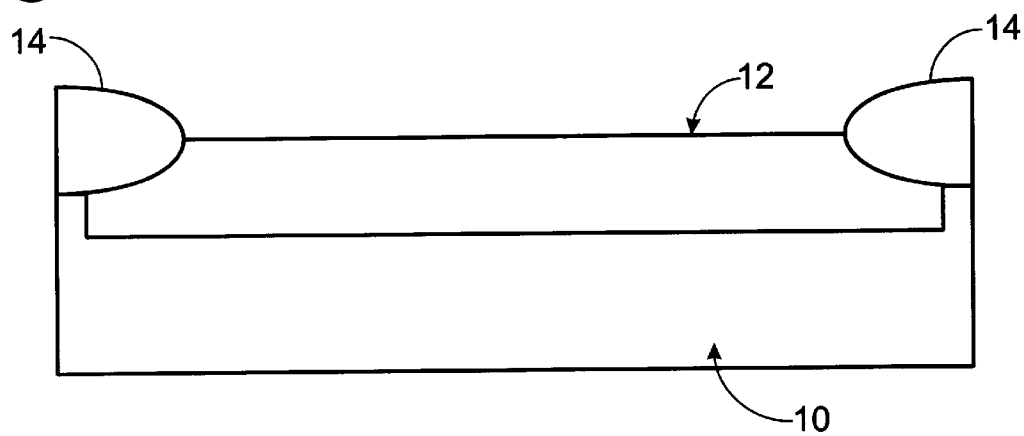
FIGS. 1–3 depict successive stages of preparation of the substrate and formation of an active region used for the FEM cell of the invention.

Turning now to FIG. 1, a silicon substrate is depicted at 10. Substrate 10, in this embodiment is a single-crystal substrate, and is formed of bulk silicon. As depicted in FIG. 1, substrate 10 has been partially etched to the configuration depicted, and a portion of the substrate has been lightly doped to form an active region, or device area, 12, which provides a desired background polarity, in this case, that of an $n^-$ region, referred to herein as a conductive channel of a first type. Active region 12 is bounded by an insulating region 14, formed of $SiO_2$. As is well known to those of a skill in the art, a multiplicity of such regions are formed on the surface of a silicon wafer. For the FEM gate unit of the invention, the cells are arranged in a perpendicular grid to form a memory array.

Using a bulk CMOS substrate as an example to explain the fabrication process, the initial step is to fabricate $n^-$ well and $p^-$ well structures, isolate these structures, and implant appropriate ions to provide threshold voltage adjustment for the transistors. Substrate 10, in this embodiment, has been made into $p^-$ silicon, or a $p^-$ well. Photoresist is used to mask sections of the wafer. Next, phosphorous ions, also referred to herein as doping impurities of a first type, are implanted at an energy of between 30 keV to 120 keV, with a dose of $1.0 \times 10^{12}$ $cm^{-2}$ to $5.0 \times 10^{13}$ $cm^{-2}$ to the $p^-$ well where the FEM gate units are to be constructed. Multiple implantation steps, and/or thermal diffusion may be required to obtain an optimum donor distribution in the $n^-$ layer. The photoresist is stripped away. The implanted $n^-$ type silicon layer may also be replaced with a selective epitaxial growth of silicon with a thickness of 100 nm to 1000 nm.

Figure 2:
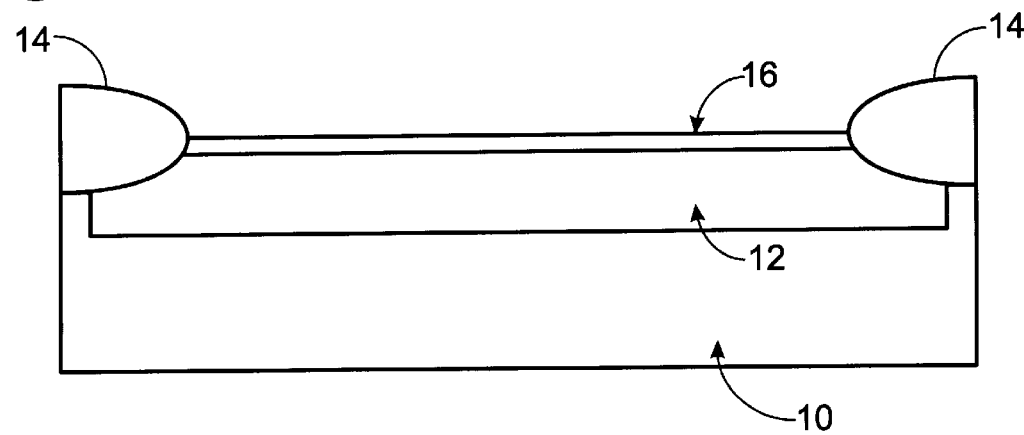

Referring now to FIG. 2, a $p^{--}$ layer 16 is next formed on active region 12. This $p^{--}$ layer may be formed by implanting B or $BF_2$ ions, referred to herein as doping impurities of a second type, on active layer 12. Boron ions may be implanted at an energy of 3 keV to 10 keV, while $BF_2$ ions are implanted with an energy level of between 15 keV and 50 keV. Ion concentration in both instances is in the range of $5 \times 10^{11}$ $cm^{-2}$ to $1 \times 10^{13}$ $cm^{-2}$. The ions are thermally activated by annealing. The implanted ions will diffuse into the $n^-$ active region, to form a $p^-n$ layer, referred to herein as a conductive channel of a second type. Annealing takes place at a temperature in a range of between 500 C and 1100 C.

Figure 3:
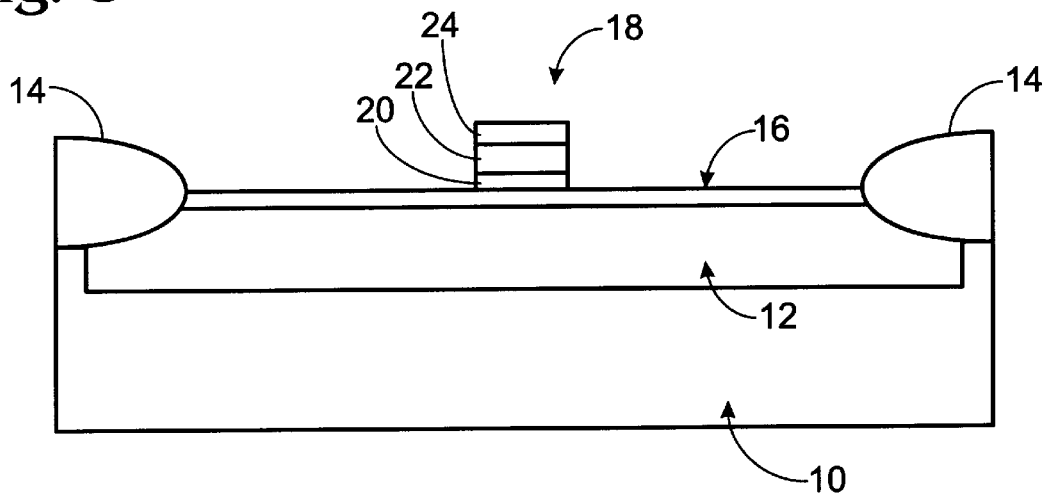

At this point, formation of the FEM gate unit may begin. Referring now to FIG. 3, a FEM gate unit is identified generally at 18 and includes a lower metal layer, or electrode, 20, the ferroelectric (FE) material 22, and a upper metal layer, or electrode, 24. The construction of FEM gate unit 18 begins with the deposition of the lower electrode on p-layer 16. Lower electrode 20 may be formed of Pt or Ir, $IrO_2$, or an alloy of Pt/Ir, or other suitable conductive material. Other appropriate conductive barrier layer material may also be used. The thickness of electrode 20 is 20 nm to 100 nm, in the preferred embodiment.

Next, the FE material is deposited by chemical vapor deposition (CVD). The FE material may be any of the following: Pb(Zr, Ti)$O_3$ (PZT), $SrBi_2Ta_2O_9$ (SBT), $Pb_5Ge_3O_{11}$, $BaTiO_3$, or $LiNbO_3$. The preferred compounds are, in order of preference, $Pb_5Ge_3O_{11}$, SBT and PZT. Most of the experimental work in the FEM gate unit field has been done on PZT compounds. The FE material 22 is deposited to a thickness of 100 nm to 400 nm.

The upper electrode 24 is then formed over the FE material. The upper electrode may be formed of the same materials as the lower electrode, to a thickness of 20 nm to 200 nm.

Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

Figure 4:
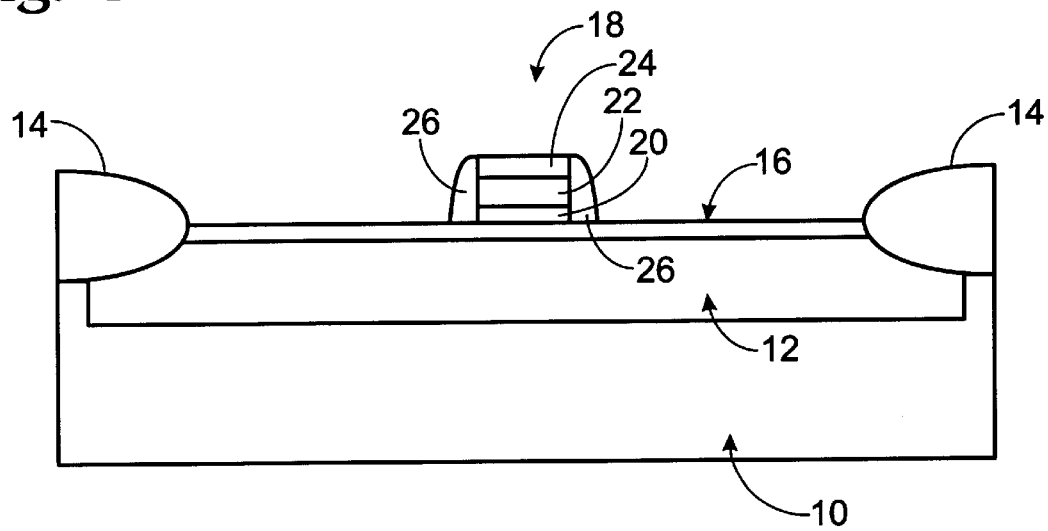
FIG. 4 depicts the FEM gate unit constructed on the substrate and surrounded by an insulating region.

A layer of $TiO_x$, 26, as shown in FIG. 4, or other suitable barrier insulation material is formed by CVD to protect the FEM gate unit. The $TiO_x$ is etched to form the sidewall insulator for the gate electrode.

Figure 5:
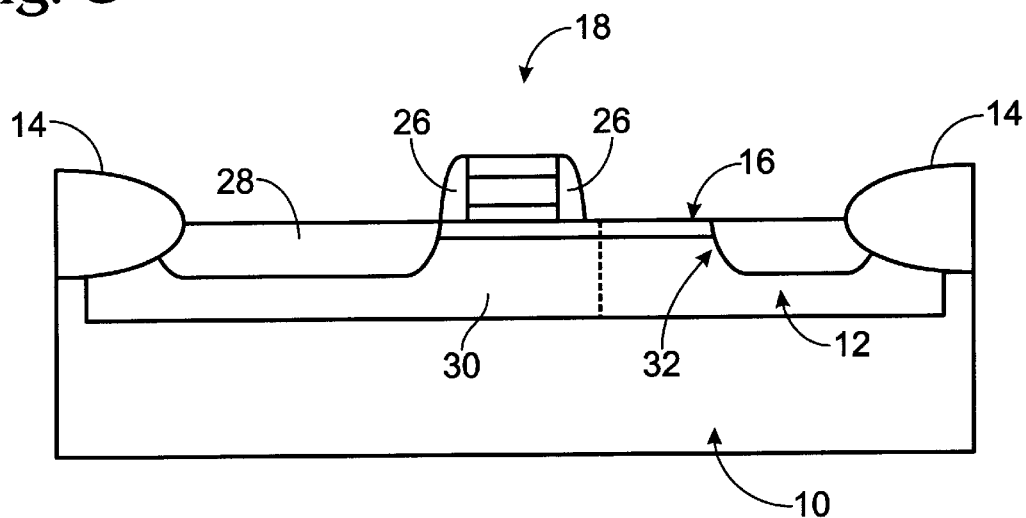
FIG. 5 depicts the FEM gate unit of the invention on the substrate with the source, gate and drain regions formed.

Turning now to FIG. 5, active region 12 may be seen to have been modified to a source region 28, a gate region 30, a drain region 32. These regions are formed by applying a photoresist across active region 12, $p^-$ layer 16 and FEM gate unit 18 to mask what will ultimately be gate region 30, and implanting the appropriate ions, also referred to herein as doping impurities of a third type, in the remainder of active region 12 to form two $n^+$ layers, also referred to herein as conductive channels of a third type, which will serve as source region 28 and drain region 32. It should be noted that $p^-$ layer 16 extends over gate junction region 30 and partially over drain junction region 32. Appropriate ion implantation in this instance may be the implantation of As ions at a preferred energy of about 50 keV, although implantation in a range of 40 keV to 70 keV is acceptable, and a dosing in a range of $1 \times 10^{15}$ $cm^{-2}$ to $5 \times 10^{15}$ $cm^{-2}$. Alternately, phosphorus ions may be implanted in an energy range of 30 keV–60 keV in the same dosing range.

Figure 6:
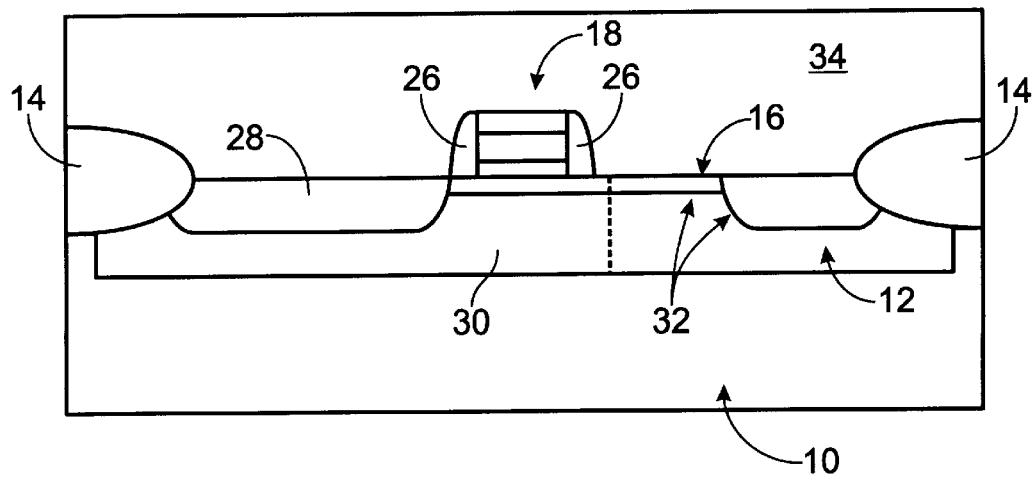
FIG. 6 depicts the FEM cell of the invention having a shallow junction layer formed under the FEM gate unit.

Referring now to FIG. 6, the wafer is heat treated to activate and defuse the implanted ions, both in the source region and drain region, and in the lower electrode. Diffusion of the B or $BF_2$ ions implanted in layer 16 results in the formation of a shallow $p^-n$ junction under FEM gate unit 18, which is the conductive channel of a second type. Temperature range for the heat treatment is in the range of 500 C to 1100 C, to allow passivation and diffusion of the implanted ions. A layer 34 of $SiO_2$ is then formed over the structure by CVD, or, other suitable passivation insulation is applied.

Figure 7:
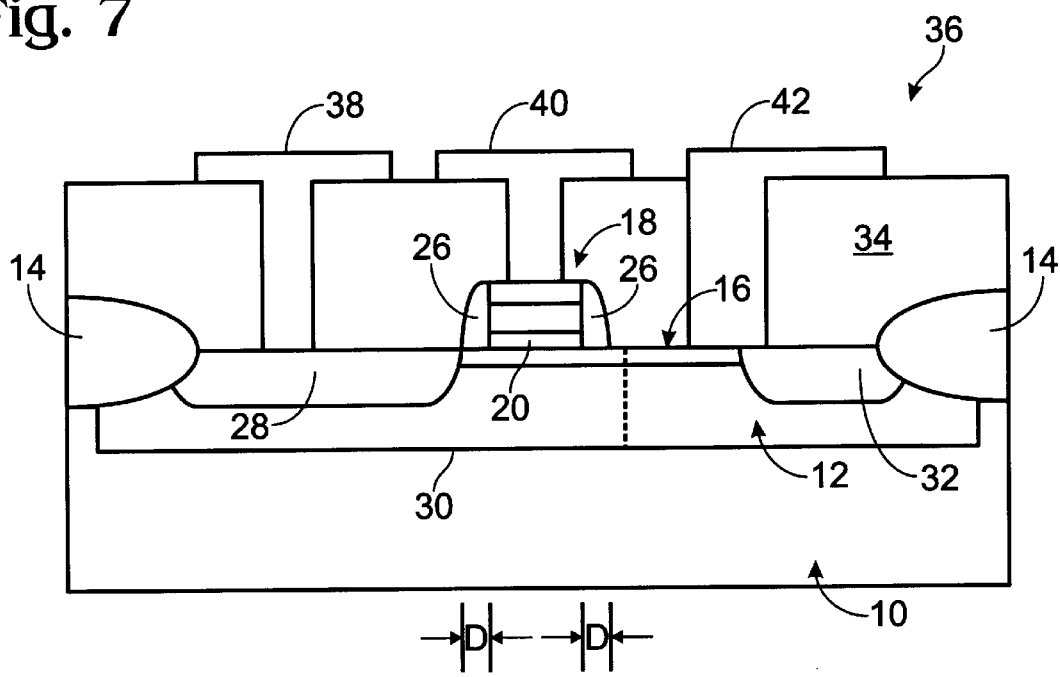
FIG. 7 depicts the completed FEM cell of the invention, and also depicts current flow therethrough.

Turning now to FIG. 7, FEM gate unit 18 is depicted as part of a FEM memory cell 36, which includes FEM gate unit 18 and the underlying source, channel and drain regions, which embodiment includes a thin shallow junction region 16, which is a $p^-n$ layer, formed under FEM gate unit 18.

To complete the description of FEM cell 36, bores are formed in oxide layer 34 to receive a source electrode 38, a gate electrode 40 and a drain electrode 42 which are connected to their respective components. Drain electrode 42 may be seen to connect to both drain region 32 and p⁻n junction 16.

The embodiment depicted in FIG. 6 represents a ferroelectric gate depletion-type MIS transistor. At zero gate voltage, the charge in the n⁻ channel underlying the FEM gate unit is completely depleted. Accordingly, the leakage current is very small. In order to maintain the small leakage, the distance between any edge of lower electrode 20 and the edges of the n⁺ source or n⁺ drain regions, represented by "D", has to be at least 50 nm in order that the leakage current remain small. However, as D increases, the series resistance of the memory cell also increases. It is therefore preferred that D be no larger than 300 nm. The gate leakage current is determined by the platinum to p⁻ type silicon shallow junction 32 and the platinum to ferroelectric material contact. The leakage current is the gate current at a very small up to moderate field intensity. The potential barrier between the p⁻ layer and n⁻ type silicon is 0.8 eV to 1.0 eV. A potential barrier of this magnitude causes the n⁻ type silicon channel to be completely depleted when the ferroelectric material is not polarized, or when the ferroelectric material is polarized with positive charge at the lower electrode. When the ferroelectric material is polarized with a negative charge at the lower electrode, the threshold voltage of the memory transistor is small. The nature of these memory charges and techniques for changing the amount of voltage necessary to the program the cells will be described later herein.

Alternately, the source/drain ion implantation and annealing may be completed before the deposition of the lower gate electrode, if the ferroelectric material is unable to sustain high temperature heat treatment.

Figure 8:
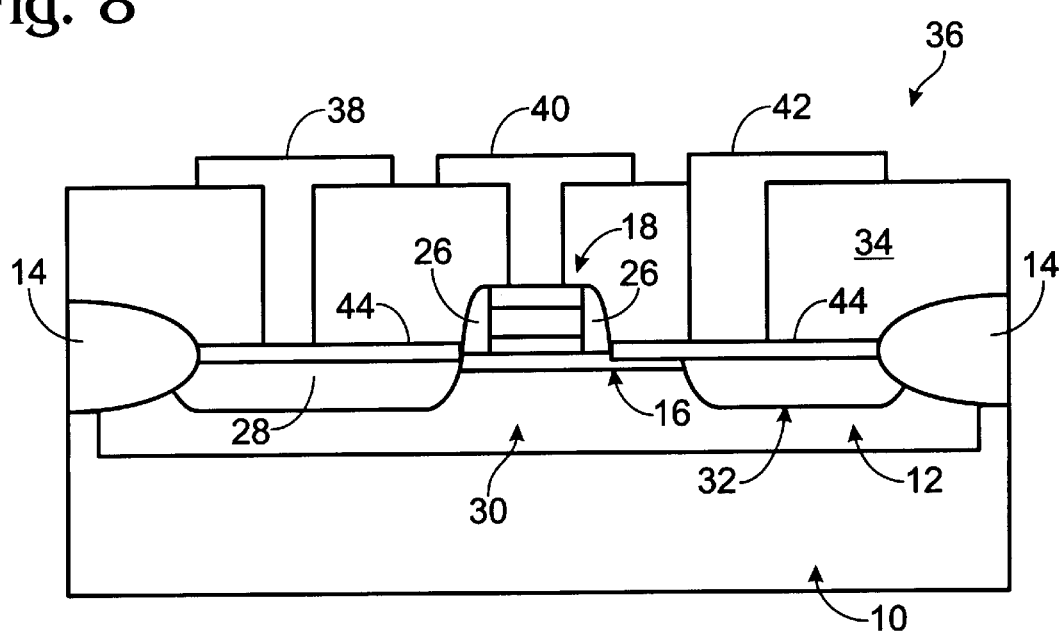
FIG. 8 depicts an alternate embodiment of the FEM cell formed on a bulk silicon substrate.

Referring now to FIG. 8, and alternate embodiment of the FEM cell is depicted, which embodiment includes two silicide layers 44, 46 formed over the source and drain junction regions. These silicide layers are formed by CVD prior to the deposition of insulating layer 34. This structure has the advantage of having lower resistance to the source region and drain region. This increases the drain current of the memory cell.

Figure 9:
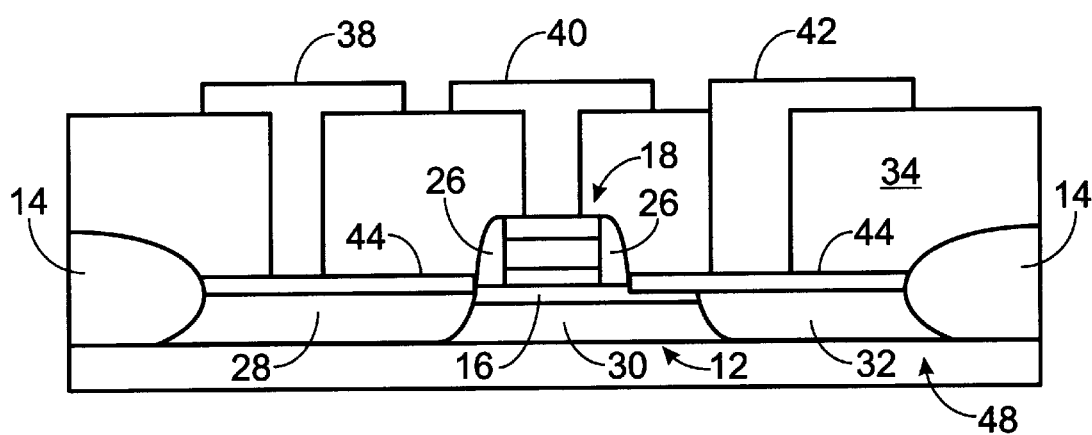
FIG. 9 depicts the alternate embodiment of the FEM cell formed on an SOI substrate.

An embodiment of the FEM cell formed on a SOI substrate 48 is depicted in FIG. 9.

Operation

The structure constructed according to the invention is particularly efficient because the FEM gate unit, located over the conductive channel on the gate region, is able to shift the polarity of the gate region, allowing efficient current flow from the source through the channel to the drain. The structure provides for total charge depletion when in an "off" condition. When in an "on" condition, current flows through the entire channel region.

Figure 10A:
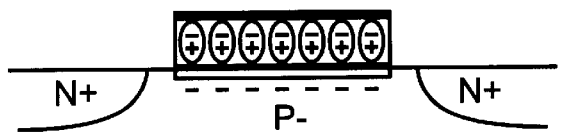
FIGS. 10A–10B depict the basic operation principle for the MFS FET devices of the invention.
Figure 10B:
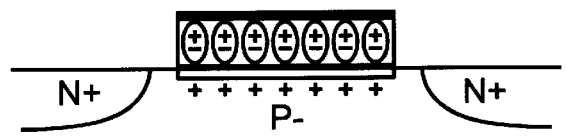

Memory cells constructed according to the invention may be placed in an array of memory cells such that the gate lines run perpendicular to the drain lines. In order to write to FEM gate unit 18, $+V_{P1}$ is applied to all gate electrodes, while the source and drain electrodes of the memory cell are at the ground potential. This polarizes FE 22 such that a negative charge is located at lower electrode 20 and a positive charge is located at upper electrode 24. (See FIG. 10b). This places FEM gate unit 18 in a high conductive state.

When a negative voltage, $-V_{P0}$, is applied to the gate electrode (program line), and a positive voltage, $+V_{P0}$ is applied to the drain, and the source is grounded, and where $|V_{P1}|>|V_{P0}|$, the FE is polarized with a positive charge at lower electrode 20. This places FEM gate unit 18 in a low conductive state. (see FIG. 10a). The write process enables each memory transistor in a memory array to be written to independent of other memory cells in the array, with no interference to or from the programming of the other memory cells in the array.

The threshold voltage for FEM gate unit 18 may be determined as follows: for a large scale array the threshold voltage at the "1" state has to be a positive value, i.e., 0.4V to 0.8V. The threshold voltage for the "0" state has to be larger than the supply voltage, i.e., 3.3 V. The n⁻ channel layer is depleted by the p⁻ type substrate junction as well as by the very shallow p⁻ surface layer and the gate bias voltage.

It can be shown that the memory window is equal to:

$$\Delta V_T = \frac{2Q_{FE}}{C_{FE}} \quad (1)$$

where $Q_{FE}$ is the remanent charge and $C_{FE}$ is the ferroelectric capacitance of the gate unit.

The width of the space in the n⁻ region of a p⁺/n junction is about 0.3 m if the doping density of the n⁻ region is $1.0\times10^{16}$ cm⁻³. It is apparent that if the thickness and doping of the n⁻ channel layer are small, the "1" state threshold voltage can be a positive value. The threshold voltage can be adjusted by the doping density and the thickness of both n-channel layer and p-surface layer, the permitivity and the remnant charge of the ferroelectric capacitor.

During a read operation, a voltage, $V_a$, of no larger than the coercive voltage, i.e., that voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

A One Transistor Memory Cell

Figure 11A:
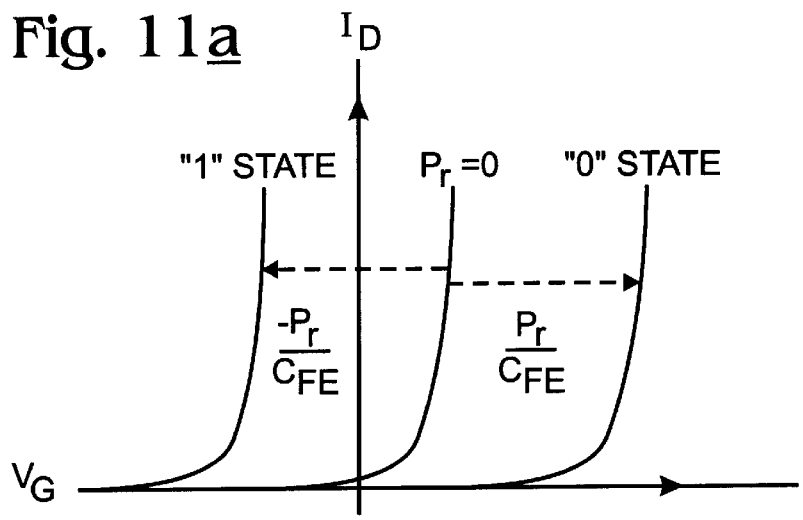
FIGS. 11A–11B are a graph of $I_D$ vs. $V_G$ for the FEM gate unit of the invention.

The general $I_D$ vs. $V_G$ plot for the MFMOS FET is depicted in FIG. 11. FIG. 11a depicts the $I_D$ vs. $V_G$ characteristics of a FEM cell with high channel doping, $N_D$. The centerline is the $I_D$ vs. $V_0$ curve when the FEM gate unit is not charged. When the FEM cell is programmed to a "1" state, the threshold voltage of the FEM cell is negative. Thus, a large drain current may flow through the channel region even if $V_G$=0V. Such a device is not suitable for large scale array applications.

Figure 11B:
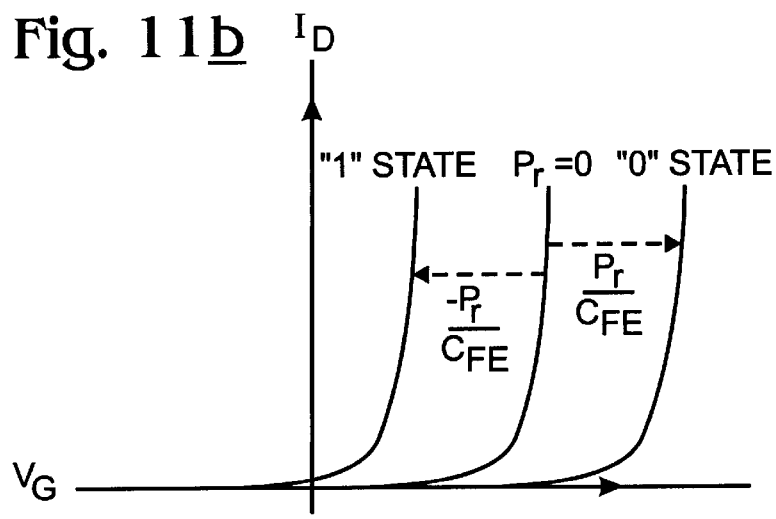

FIG. 11b depicts the $I_D$ vs. $V_G$ characteristics of a FEM cell with low channel doping $N_D$. The threshold voltage of the FEM cell when it is programmed to a "1" state is positive. No current may flow through the device when the gate is at ground potential. A large scale memory array of such devices will have a very small standby leakage current, and will not require frequent refreshing.

Ferroelectric $Pb_5Ge_3O_{11}$ Thin Film for MFMOS Applications

It can be shown that the lower ferroelectric capacitance results in higher memory window and lower programming voltage. Thicker film and lower $\in_r$ material can result in lower ferroelectric capacitance; however, the former choice could increase the programming voltage if the switching field for ferroelectric is well defined. Common oxide ferroelectric materials exhibit higher $\in_r$ and $T_c$. Oxide $Pb_5Ge_3O_{11}$ thin film has very low $\in_r$ and moderate $T_c$ (178 C). Table I compares the memory window of MFMOS devices with ferroelectric gate of $Pb_5Ge_3O_{11}$, PZT and $SrBi_2Ta_2O_9$ thin films. Even though the steady state polarization for $Pb_5Ge_3O_{11}$ thin film is much lower than that for PZT and $SrBi_2Ta_2O_9$ film films, the memory window for $Pb_5Ge_3O_{11}$ gate controlled MFMOS device is larger than its counterparts due to its low $\in_r$.

TABLE I

Memory Windows for MFMOS Devices with Various Ferroelectrics

| Ferroelectric | $Pb(Zr, Ti)O_3$ | $SrBi_2Ta_2O_9$ | $Pb_5Ge_3O_{11}$ |
|---|---|---|---|
| $P_r$ ($\mu C/cm^2$) | 15 | 7 | 3.5 |
| $\epsilon_r$ | 1000 | 280 | 35 |
| $d_{Ferro}$ (Å) | 2000 | 2000 | 2000 |
| $V_{dep}$ (V) | 3.14 | 4.39 | 6.87 |
| $P_r^*$ ($\mu C/cm^2$) when $V_{dep} = 0.5$ V | 2.4 | 0.8 | 0.25 |
| Memory Window $2P_r^*/C_{FE}$ (V) | 1.08 | 1.29 | 3.23 |

Steady state $V_{dep}$ is assumed to be 0.5 V

Thus, a FEM memory cell, and a method of constructing same has been disclosed. The FEM gate unit may be constructed as a single transistor device, or it may be constructed with an associated MOS transistor. Although a preferred embodiment of the invention has been disclosed, it should be appreciated that further variations may be made to the architecture and method without departing from the scope of the invention as defined in the appended claims.

We claim:

1. A method of forming a semiconductor structure having a ferroelectric memory (FEM) gate unit on a silicon substrate, comprising:

forming a silicon device area for the FEM gate unit;

implanting doping impurities of a first type in the silicon device area to form a conductive channel of a first type for use as a gate junction region;

implanting doping impurities of a second type over the device area to form a conductive layer of a second type;

depositing an FEM gate unit over the conductive channel of the second type, including depositing a lower metal layer, a FE layer and an upper metal layer, wherein the FEM gate unit is sized on the gate junction region such that any edge of the FEM gate unit is a distance "D" from the edges of a source junction region and a drain junction region, where "D" is between about 50 nm and 300 nm;

depositing an insulating structure over the FEM gate unit; and implanting doping impurities of a third type in the silicon device area on either side of the gate junction region to form a conductive channel of a third type for use as a source junction region and a drain junction region, wherein the conductive channel of the second type extends into the drain junction region.

2. The method of claim 1 wherein forming a conductive channel of the second type includes implanting a dopant taken from the group consisting of B or $BF_2$ at an energy in a range of 3 keV to 10 keV or 15 keV to 50 keV, respectively, and a dose of $1 \times 10^{11}$ cm$^{-2}$ to $1 \times 10^{13}$ cm$^{-2}$ in the device area.

3. The method of claim 1 which includes annealing the structure at a temperature of about 500 C to 1100 C to diffuse B or $BF_2$ ions from the conductive channel of the second type into the gate junction region to form the conductive channel of the second type.

4. The method of claim 1 wherein said depositing the FEM gate unit includes depositing a lower metal layer of material taken from the group consisting of Pt, Ir, $IrO_2$ and Pt/Ir alloy, having a thickness of about 20 nm to 100 nm, depositing a FE layer of material taken from the group consisting of $Pb(Zr, Ti)O_3$ (PZT), $SrBi_2Ta_2O_9$ (SBT), $Pb_5Ge_3O_{11}$, $BaTiO_3$ and $LiNbO_3$, having a thickness of about 100 nm to 400 nm, and depositing an upper metal layer of material taken from the group consisting of Pt, Ir, $IrO_2$ and Pt/Ir alloy, having a thickness of 20 nm to 100 nm.

5. The method of claim 1 wherein said implanting doping impurities of the third type includes doping the device area with ions taken from the group consisting of As, implanted at an energy of about 40 keV to 70 keV, and phosphorous, implanted at an energy of about 30 keV to 60 keV, the ions having a dose of about $1 \times 10^5$ cm$^{-2}$ to $5 \times 10^5$ cm$^{-2}$.

6. The method of claim 1 wherein said depositing an insulating structure about the FEM gate unit includes depositing a layer of $TiO_x$ over the FEM gate unit.

7. The method of claim 1 which further includes depositing a silicide layer over the source junction region and the drain junction region.

8. A method of forming a semiconductor structure having a ferroelectric memory (FEM) gate unit on a silicon substrate, comprising:

forming a silicon device area for the FEM gate unit;

implanting doping impurities of a first type in the silicon device area to form a conductive channel of a first type for use as a gate junction region;

implanting doping impurities of a second type over the device area to form a conductive channel of a second type;

depositing an FEM gate unit over the conductive channel of the second type above the gate junction region, including depositing a lower metal layer of material taken from the group consisting of Pt, Ir, $IrO_2$ and Pt/Ir alloy, having a thickness of about 20 nm to 100 nm, a FE layer of material taken from the group consisting of $Pb(Zr, Ti)O_3$ (PZT), $SrBi_2Ta_2O_9$ (SBT), $Pb_5Ge_3O_{11}$, $BaTiO_3$ and $LiNbO_3$, having a thickness of about 100 nm to 400 nm, and an upper metal layer of material taken from the group consisting of Pt, Ir, $IrO_2$ and Pt/Ir alloy, having a thickness of 20 nm to 100 nm, wherein the FEM gate unit is sized on the gate junction region such that any edge of the FEM gate unit is a distance "D" from the edges of a source junction region and a drain junction region, where "D" is between about 50 nm and 300 nm;

depositing an insulating structure about the FEM gate unit; and implanting doping impurities of a third type in the silicon device area on either side of the gate junction region to form a conductive channel of a third type for use as a source junction region and a drain junction region, wherein the conductive channel of the second type extends over a portion of the drain junction region.

9. The method of claim 8 wherein forming a conductive channel of the second type includes implanting a dopant taken from the group consisting of B or $BF_2$ at an energy in a range of 3 keV to 10 keV or 15 keV to 50 keV, respectively, and a dose of $1 \times 10^{11}$ cm$^{-2}$ to $1 \times 10^{13}$ cm$^{-2}$ in the device area.

10. The method of claim 8 which includes annealing the structure at a temperature of about 500 C to 1100 C to diffuse B or $BF_2$ ions from the conductive channel of the second type into the gate junction region to form the conductive channel of the second type.

11. The method of claim 8 wherein said implanting doping impurities of the third type includes doping the device area with ions taken from the group consisting of As, implanted at an energy of about 40 keV to 70 keV, and phosphorous, implanted at an energy of about 30 keV to 60 keV, the ions having a dose of about $1 \times 10^{15}$ cm$^{-2}$ to $5 \times 10^{15}$ cm$^{-2}$.

12. The method of claim 8 wherein said depositing an insulating structure about the FEM gate unit includes depositing a layer of TiO$_x$ over the FEM gate unit.

13. The method of claim 8 which further includes forming a layer of suicide over the source junction region and the drain junction region.

14. A ferroelectric memory (FEM) cell comprising:

a silicon substrate including an active region therein;

a gate junction region located in said active region, doped to form a conductive channel of a first type;

a source junction region and a drain junction region located in said active region on either side of said gate junction region, doped to form a pair of conductive channels of a third type;

a conductive channel of a second type located on said gate junction region and extending partially into said drain junction region;

a FEM gate unit including a lower metal layer, a FE layer and an upper metal layer; wherein said FEM gate unit overlays said conductive channel of said second type and has a surface area less than that of said conductive channel region of said second type, and is sized on the gate junction region such that any edge of said FEM gate unit is a distance "D" from the edges of said source junction region and said drain junction region, where "D" is between about 50 nm and 300 nm;

an insulating layer, having an upper surface, overlying said junction regions, said FEM gate unit and said substrate; and a source electrode and a drain electrode, each located on the upper surface of said insulating layer and extending therethrough to make electrical contact with their respective junction regions, wherein said drain electrode makes contact with said drain junction region and said conductive channel of said second type, and a gate electrode located on the upper surface of said insulating layer and extending therethrough to make electrical contact with the upper metal layer of said FEM gate unit.

15. The FEM cell of claim 14 wherein said conductive channel of said second type includes ions implanted therein, and wherein the ions are taken from the group consisting of B and BF$_2$, implanted at an energy in a range of 3 keV to 10 keV and 15 keV to 50 keV, respectively, and a dose of $1 \times 10^{11}$ cm$^{-2}$ to $1 \times 10^{13}$ cm$^{-2}$, which diffuse from the device area during annealing of the structure at a temperature of about 500 C to 1100 C.

16. The FEM cell of claim 14 wherein said FEM gate unit includes a lower metal layer of Pt, having a thickness of about 20 nm to 100 nm, a FE layer of material taken from the group consisting of Pb(Zr, Ti)O$_3$ (PZT), SrBi$_2$Ta$_2$O$_9$ (SBT), Pb$_5$Ge$_3$O$_{11}$, BaTiO$_3$ and LiNbO$_3$, having a thickness of about 100 nm to 400 nm, and an upper metal layer of material taken from the group consisting of Pt, Ir, IrO$_2$ and Pt/Ir alloy, having a thickness of 20 nm to 100 nm.

17. The FEM cell of claim 14 wherein said active region includes ions taken from the group consisting of As, implanted at an energy of about 40 keV to 70 keV, and phosphorous, implanted at an energy of about 30 keV to 60 keV, the ions having a dose of about $1 \times 10^{15}$ cm$^{-2}$ to $5 \times 10^{15}$ cm$^{-2}$.

18. The FEM cell of claim 14 which further includes a silicide layer overlaying said source junction region and said drain junction region.

* * * * *